(12) United States Patent
Yun et al.

(10) Patent No.: US 10,136,109 B2
(45) Date of Patent: *Nov. 20, 2018

(54) IMAGE SENSOR INCLUDING COLOR SEPARATION ELEMENT AND IMAGE PICKUP APPARATUS INCLUDING THE IMAGE SENSOR

(71) Applicant: SAMSUNG ELECTRONICS CO., LTD., Suwon-si (KR)

(72) Inventors: Seokho Yun, Hwaseong-si (KR); Sunghyun Nam, Yongin-si (KR); Sookyoung Roh, Seoul (KR); Hongkyu Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/833,083

(22) Filed: Dec. 6, 2017

(65) Prior Publication Data
US 2018/0098038 A1 Apr. 5, 2018

Related U.S. Application Data

(63) Continuation of application No. 14/791,746, filed on Jul. 6, 2015, now Pat. No. 9,860,492.

(30) Foreign Application Priority Data

Jul. 3, 2014 (KR) .......................... 10-2014-0083233

(51) Int. Cl.
*H04N 9/04* (2006.01)
*H01L 27/146* (2006.01)
(Continued)

(52) U.S. Cl.
CPC ............ *H04N 9/045* (2013.01); *G02B 5/201* (2013.01); *G02B 5/22* (2013.01);
(Continued)

(58) Field of Classification Search
None
See application file for complete search history.

(56) References Cited

U.S. PATENT DOCUMENTS 7,176,446 B1 2/2007 Wiedemann
8,013,928 B2 9/2011 Egawa
(Continued)

FOREIGN PATENT DOCUMENTS

KR 10-2011-0111090 A 10/2011
KR 10-2009-0016368 A 2/2013
(Continued)

OTHER PUBLICATIONS

Communication dated Oct. 27, 2015 issued by European Patent Office in counterpart European Patent Application No. 15175303.5.
(Continued)

*Primary Examiner* — Paul Berardesca
(74) *Attorney, Agent, or Firm* — Sughrue Mion, PLLC

(57) ABSTRACT

An image sensor includes a pixel array having a Bayer pattern structure including a first pixel row in which first pixels and second pixels are alternately provided and a second pixel row in which additional ones of the second pixels and third pixels are alternately provided, a first element to control light of a first wavelength band to travel in directions toward left and right sides of the first element and to control light of a second wavelength band of the incident light to travel in a direction directly under the first element, and a second element to control light of a third wavelength band to travel in the directions toward the left and right sides of the second element and to control the light
(Continued)

of the second wavelength band to travel in a direction directly under the second element.

19 Claims, 10 Drawing Sheets

(51) Int. Cl.
*G02B 5/22* (2006.01)
*G02B 5/20* (2006.01)

(52) U.S. Cl.
CPC .. *H01L 27/14621* (2013.01); *H01L 27/14625* (2013.01); *H01L 27/14643* (2013.01)

(56) References Cited

U.S. PATENT DOCUMENTS

| | | | |
|---|---|---|---|
| 8,063,352 | B2 | 11/2011 | Blayvas |
| 8,289,422 | B2 | 10/2012 | Hiramoto et al. |
| 8,514,319 | B2 | 8/2013 | Hiramoto et al. |
| 2003/0063204 | A1 | 4/2003 | Suda |
| 2003/0179457 | A1 | 9/2003 | Dobashi et al. |
| 2010/0019129 | A1 | 1/2010 | Ishigaki et al. |
| 2011/0037869 | A1 | 2/2011 | Hiramoto et al. |
| 2012/0206637 | A1 | 8/2012 | Hiramoto et al. |
| 2012/0212656 | A1 | 8/2012 | Hiramoto et al. |
| 2014/0078355 | A1 | 3/2014 | Hiramoto et al. |
| 2014/0333796 | A1 | 11/2014 | Nishiwaki et al. |
| 2016/0064448 | A1 | 3/2016 | Shin |

FOREIGN PATENT DOCUMENTS

| | | |
|---|---|---|
| WO | 03/027725 A3 | 4/2003 |
| WO | 2014/034149 A1 | 3/2014 |

OTHER PUBLICATIONS

Seiji Nishiwaki et al., "Efficient colour splitters for high-pixel-density image sensors", Nature Photonics, vol. 7, Feb. 3, 2013, pp. 240-246.

IMAGE SENSOR INCLUDING COLOR SEPARATION ELEMENT AND IMAGE PICKUP APPARATUS INCLUDING THE IMAGE SENSOR

CROSS-REFERENCE TO RELATED APPLICATIONS

This application is a Continuation of U.S. application Ser. No. 14/791,746, filed Jul. 6, 2015, which claims the benefit of Korean Patent Application No. 10-2014-0083233, filed on Jul. 3, 2014, in the Korean Intellectual Property Office, the disclosures of which are incorporated herein by reference in their entireties.

BACKGROUND

1. Field

The exemplary embodiments relate to an image sensor including a color separation element and an image pickup apparatus including the image sensor, and more particularly, to an image sensor having an improved light use efficiency by using a color separation element, and an image pickup apparatus including the image sensor.

2. Description of the Related Art

Color display devices or color image sensors usually display an image of various colors or detect a color of incident light by using a color filter. An RGB color filter method, in which, for example, a green filter is arranged at two pixels of four pixels and a blue filter and a red filter are arranged in the other two pixels, is most widely employed by a currently used color display device or color image sensor. In addition to the RGB color filter method, a CYGM color filter method may be employed in which color filters of cyan, yellow, green, and magenta, which are complementary colors, are respectively arranged at four pixels.

However, a color filter may have a low light use efficiency because the color filter absorbs light of colors other than a color corresponding to the color filter. For example, when an RGB color filter is in use, only ⅓ of the incident light is transmitted and the other portion, that is, ⅔, of the incident light is absorbed. Accordingly, the light use efficiency may be about 33%. Accordingly, for the color display device or a color image sensor, most of a light loss is generated in the color filter.

Recently, to improve the light use efficiency of the color display device or color image sensor, a color separation element is being used instead of the color filter. The color separation element may separate the color of an incident light by using the diffraction or refraction characteristics of light that vary according to a wavelength of the light. The colors separated by the color separation element may be provided to pixels corresponding to the colors, respectively.

SUMMARY

Additional aspects will be set forth in part in the description which follows and, in part, will be apparent from the description, or may be learned by practice of the presented exemplary embodiments.

According to an aspect of an exemplary embodiment, there is provided an image sensor including a pixel array including Bayer patterns, each of the Bayer patterns including a first pixel and a third pixel provided in a first diagonal direction and two second pixels provided in a second diagonal direction crossing the first diagonal direction, and a color separation element provided to face the second pixels in the second diagonal direction, wherein the color separation element is configured to control light of a first wavelength band of incident light to travel in a first lateral direction of the color separation element toward the first pixel, to control light of a third wavelength band of the incident light to travel in a second lateral direction of the color separation element toward the third pixel, and to control light of a second wavelength band of the incident light to travel in a downward direction of the color separation element toward the second pixels.

The image sensor may further include a color filter layer that is provided on the pixel array, wherein the color filter layer includes at least one of a first color filter provided adjacent to the first pixel, a second color filter provided adjacent to the second pixel, and a third color filter provided adjacent to the third pixel.

The image sensor may further include a transparent dielectric layer provided on the color filter layer, and a microlens provided on the transparent dielectric layer.

The microlens may be provided to face the pixel array including the Bayer patterns.

According to another aspect of an exemplary embodiment, there is provided an image sensor including a pixel array including Bayer patterns, each of the Bayer patterns including a first pixel and a third pixel provided in a first diagonal direction and two second pixels provided in a second diagonal direction crossing the first diagonal direction, color separation elements provided to face the second pixels, respectively, and a color filter layer provided on the pixel array, wherein each of the color separation elements is configured to control light of a second wavelength band of incident light to travel in a downward direction of the color separation element and to control mixed light including a mixture of light of a first wavelength band of the incident light and light of a third wavelength band of the incident light to travel in directions toward left and right sides of the color separation element.

One of the color separation elements may include a first color separation element provided in a first direction and a second color separation element provided in a second direction perpendicular to the first direction.

The first color separation element and the second color element may be alternately provided to face the second pixels.

Both of the first color separation element and the second color element may be provided adjacent to one of the second pixels.

The color separation elements may be oriented in the second diagonal direction.

One of the color separation elements may include a first color separation element oriented in the first diagonal direction and a second color separation element oriented in the second diagonal direction.

The image sensor may further include a transparent dielectric layer provided on the color filter layer, and microlenses provided on the transparent dielectric layer, wherein the microlenses are separately provided at each of the first, second, and third pixels.

The light of the second wavelength band separated by the color separation elements may be incident on the second pixels and the mixed light of the first and second wavelength bands and a white light may be incident together on the first and third pixels.

The color filter layer may include a first color filter provided on the first pixel and configured to transmit the light of the first wavelength band and a third color filter provided on the third pixel and configured to transmit the light of the third wavelength band.

The light of the first wavelength band may be red light, the light of the second wavelength band may be green light, and the light of the third wavelength band may be blue light.

According to another aspect of an exemplary embodiment, there is provided an image sensor including a pixel array including a first pixel and a third pixel provided in a first diagonal direction and two second pixels provided in a second diagonal direction crossing the first diagonal direction, and a first color separation element oriented in the second diagonal direction and facing the second pixels.

The image sensor may further include a second color separation element oriented in the first diagonal direction and facing the second pixels.

The first color separation element may be configured to control light of a first wavelength band of incident light to travel in a first lateral direction of the first color separation element toward the first pixel, to control light of a third wavelength band of the incident light to travel in a second lateral direction of the first color separation element toward the third pixel, and to control light of a second wavelength band of the incident light to travel in a downward direction of the first color separation element toward the second pixels.

The second color separation element may be configured to control light of a first wavelength band of incident light to travel in a first lateral direction of the second color separation element toward the first pixel, to control light of a third wavelength band of the incident light to travel in a second lateral direction of the second color separation element toward the third pixel, and to control light of a second wavelength band of the incident light to travel in a downward direction of the second color separation element toward the second pixels.

The image sensor may further include a color filter layer that is provided on the pixel array, wherein the color filter layer may include at least one of a first color filter provided adjacent to the first pixel, a second color filter provided adjacent to one of the second pixels, and a third color filter provided adjacent to the third pixel.

The image sensor may further include a transparent dielectric layer provided on the color filter layer, wherein the first color separation element may be buried in the transparent dielectric layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
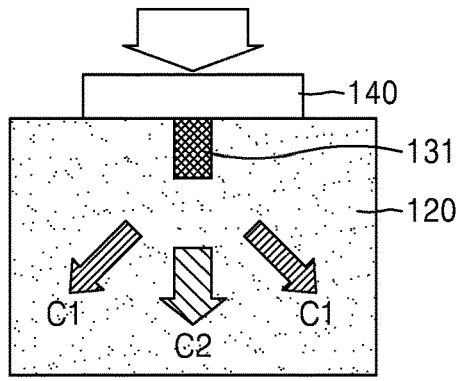
FIGS. 1, 2, 3 and 4 are cross-sectional views schematically and exemplarily illustrating the color separation characteristics of various color separation elements.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the exemplary embodiments. Expressions such as "at least one of," when preceding a list of elements, modify the entire list of elements and do not modify the individual elements of the list.

An image sensor including a color separation element, and an image pickup apparatus including the image sensor, are described in detail with reference to the accompanying drawings. In the following descriptions, like reference numerals refer to like elements. In the drawings, the size of each element is exaggerated for clarity and convenience of explanation. Also, in the following description of a layer structure, when a layer is described to exist "on" or "above" another layer, the layer may exist directly on or indirectly above the other layer, or a third layer may be interposed therebetween.

FIGS. 1, 2, 3 and 4 are cross-sectional views schematically and exemplarily illustrating the color separation characteristics of various color separation elements 131, 132, 133, and 134. The color separation elements 131, 132, 133, and 134 separate incident light according to a wavelength thereof to allow light of different wavelength bands to travel along different paths. The color separation elements 131, 132, 133, and 134 change the traveling paths of light according to the wavelengths of incident lights by using diffraction or refraction characteristics of light varying according to the wavelength thereof. For example, the color separation elements 131, 132, 133, and 134 have a variety of shapes such as a rod shape having a transparent symmetrical or asymmetrical structure or a prism shape having an inclined surface, and various designs for a color separation element according to a desired spectrum distribution of an exit light may be available.

For example, referring to FIG. 1, the first color separation element 131 may be configured to allow (e.g., control) light C1 of a first wavelength band of an incident light to travel in oblique directions toward the left and right sides and light C2 of a second wavelength band of the incident light to travel in a direction along a center axis, that is, in a direction directly under the first color separation element 131. Also, referring to FIG. 2, the second color separation element 132 may be configured to allow light C3 of a third wavelength band of the incident light to travel in oblique directions toward the left and right sides and the light C2 of the second wavelength band of the incident light to travel in the direction along the center axis. Also, referring to FIG. 3, the third color separation element 133 may be configured to allow the light C1 of the first wavelength band of the incident light to travel in an oblique direction toward the left side, the light C2 of the second wavelength band of the incident light to travel in the direction along the center axis, and the light C3 of the third wavelength band of the incident light to travel in the oblique direction toward the right side. Referring to FIG. 4, the fourth color separation element 134 may be configured to allow the light C2 of the second wavelength band of the incident light to travel in the direction along the center axis and light C1+C3 of the other wavelength band of the incident light to travel in oblique directions toward the left and right sides. In other words, the light separated by the fourth color separation element 134 and traveling in the direction toward the left and right sides may be a mixed light of the light C1 of the first wavelength band and the light C3 of the third wavelength band. For example, the light C1 of the first wavelength band may be a red-based light, the light C2 of the second wavelength band may be a green-based light, and the light C3 of the third wavelength band may be blue-based light. However, the present exemplary embodiment is not limited thereto.

The first to fourth color separation elements 131, 132, 133, and 134 each may be buried in a transparent dielectric layer 120 and fixed therein as illustrated in FIGS. 1 to 4. A microlens 140 may be arranged on each of the first to fourth color separation elements 131, 132, 133, and 134 to focus the incident light onto each of the first to fourth color separation elements 131, 132, 133, and 134. However, the arrangement of the microlens 140 is optional and may be omitted if the color separation efficiency of each of the first to fourth color separation elements 131, 132, 133, and 134 is sufficiently high.

In order to sufficiently diffract and refract the incident light, the first to fourth color separation elements 131, 132, 133, and 134 may be formed of a material having a refractive index higher than that of surroundings. In other words, the refractive indexes of the first to fourth color separation elements 131, 132, 133, and 134 may be higher than that of the transparent dielectric layer 120. For example, the transparent dielectric layer 120 may be formed of $SiO_2$ or siloxane-based spin on glass (SOG). The first to fourth color separation elements 131, 132, 133, and 134 may be formed of a high refractive material such as $TiO_2$, $SiN_3$, ZnS, ZnSe, and $Si_3N_4$. The detailed shapes and materials of the first to fourth color separation elements 131, 132, 133, and 134 may be diversely selected according to desired color separation characteristics.

Figure 2:
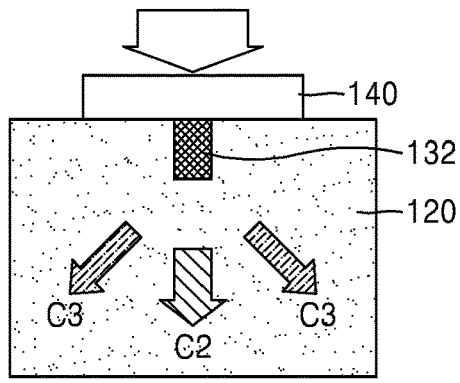
Figure 5:
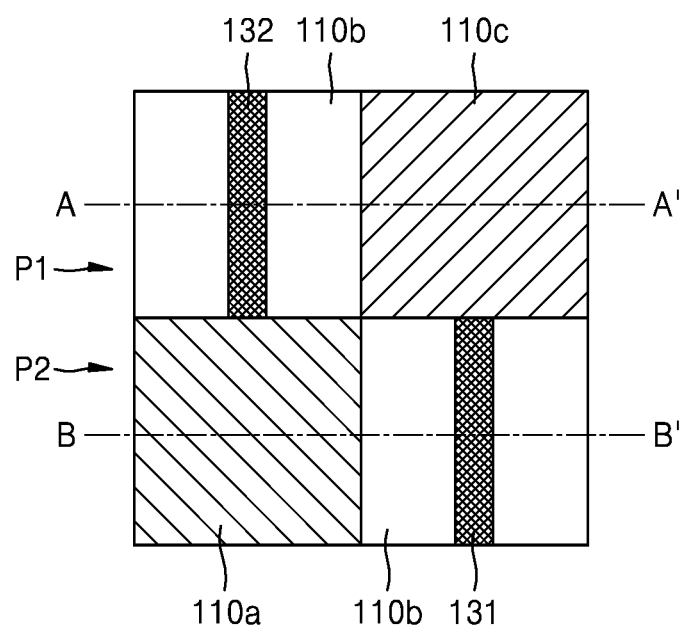
FIG. 5 is a plan view schematically illustrating a pixel structure of an image sensor including the color separation elements of FIGS. 1 and 2, according to an exemplary embodiment.

FIG. 5 is a plan view schematically illustrating a pixel structure of an image sensor including the first and second color separation elements 131 and 132 of FIGS. 1 and 2, according to an exemplary embodiment. Referring to FIG. 5, the image sensor may have a Bayer pattern structure in which a first pixel 110a and a third pixel 110c are arranged in a first diagonal direction and two second pixels 110b are arranged in a second diagonal direction crossing the first diagonal direction. Although FIG. 5 illustrates one unit having a Bayer pattern, the image sensor may include a pixel array including a plurality of Bayer patterns arranged in two dimensions. For example, the image sensor may include a first pixel row P1 in which a plurality of second pixels 110b and a plurality of third pixels 110c are alternately arranged in a horizontal direction and a plurality of first pixels 110a and a plurality of second pixels 110b are alternately arranged in the horizontal direction. A plurality of first pixel rows P1 and a plurality of second pixel rows P2 may be alternately arranged in a vertical direction.

Also, the image sensor may include the second color separation element 132 that is arranged facing the second pixel 110b in the first pixel row P1 and the first color separation element 131 that is arranged facing the second pixel 110b in the second pixel row P2. As described above, the first color separation element 131 may allow the light C1 of the first wavelength band of the incident light to obliquely travel toward the left and right sides and the light C2 of the second wavelength band of the incident light to travel in the direction directly under the first color separation element 131. Accordingly, the light C1 of the first wavelength band separated by the first color separation element 131 may be incident on the first pixel 110a adjacent to the second pixel 110b in the second pixel row P2 and the light C2 of the second wavelength band may be incident on the second pixel 110b facing the first color separation element 131 in the second pixel row P2. Also, the second color separation element 132 may allow the light C3 of the third wavelength band of the incident light to obliquely travel toward the left and right sides and the light C2 of the second wavelength band to travel in the direction directly under the second color separation element 132. Accordingly, the light C3 of the third wavelength band separated by the second color separation element 132 may be incident on the third pixel 110c adjacent to the second pixel 110b in the first pixel row P1 and the light C2 of the second wavelength band may be incident on the second pixel 110b facing the second color separation element 132 in the first pixel row P1.

Figure 6A:
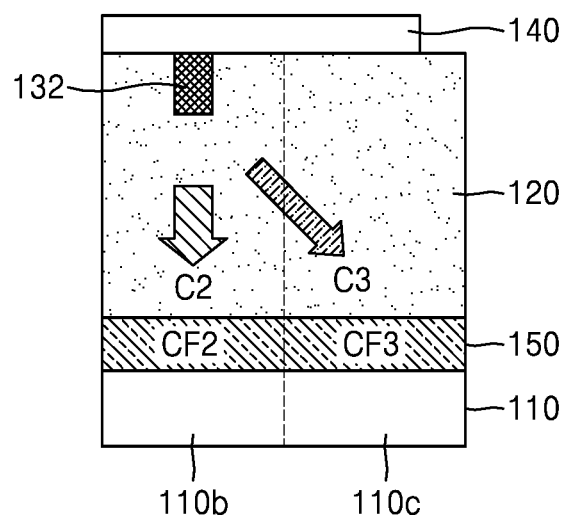
FIG. 6A is a cross-sectional view taken along the line A-A' of the image sensor of FIG. 5.

FIG. 6A is a cross-sectional view taken along the line A-A' of the first pixel row P1 of the image sensor of FIG. 5. Referring to FIG. 6A, the first pixel row P1 of the image sensor may include a light sensing layer 110 that converts the intensity of incident light to an electric signal, a color filter layer 150 arranged on the light sensing layer 110 and that transmits light of a desired wavelength band only, the transparent dielectric layer 120 arranged on the color filter layer 150, the second color separation element 132 buried in the transparent dielectric layer 120 and fixed therein, and the microlens 140 arranged on the transparent dielectric layer 120. The second pixel 110b and the third pixel 110c may be arranged in the light sensing layer 110 in the first pixel row P1. The color filter layer 150 may include a second color filter CF2 that is arranged on the second pixel 110b and that transmits only the light C2 of the second wavelength band and a third color filter CF3 that is arranged on the third pixel 110c and that transmits only the light C3 of the third wavelength band. The second color separation element 132 may be arranged facing the second pixel 110b.

As illustrated in FIG. 6A, of the light incident on the second color separation element 132, the light C2 of the second wavelength band may be incident on the second pixel 110b by passing through the second color filter CF2 disposed directly under the second color separation element 132. Also, the light C3 of the third wavelength band may be incident on the third pixel 110c by obliquely traveling toward the left and right sides of the second color separation element 132 and passing through the third color filter CF3.

Even when the second and third color filters CF2 and CF3 are used, the light C2 and C3 that are color-separated to a considerable degree by the second color separation element 132 are incident on the second and third color filters CF2 and CF3, respectively, and thus loss of light due to the color filter layer 150 is not severe. If the color separation by the second color separation element 132 is sufficient, the color filter layer 150 may be omitted. Alternatively, some of the second and third color filters CF2 and CF3 may be omitted.

Figure 6B:
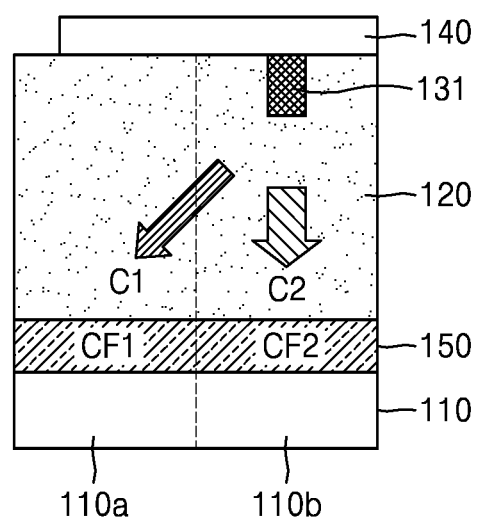
FIG. 6B is a cross-sectional view taken along the line B-B' of the image sensor of FIG. 5.

FIG. 6B is a cross-sectional view taken along the line B-B' of the second pixel row P2 of the image sensor of FIG. 5. Referring to FIG. 6B, the second pixel row P2 of the image sensor may include the light sensing layer 110 that converts the intensity of incident light to an electric signal, the color filter layer 150 arranged on the light sensing layer 110 and that transmits light of a desired wavelength band only, the transparent dielectric layer 120 arranged on the color filter layer 150, the first color separation element 131 buried in the transparent dielectric layer 120 and fixed therein, and the microlens 140 arranged on the transparent dielectric layer 120. The first pixel 110a and the second pixel 110b may be arranged in the light sensing layer 110 in the second pixel row P2. The color filter layer 150 may include the first color filter CF1 that is arranged on the first pixel 110a and that transmits only the light C1 of the first wavelength band and the second color filter CF2 that is arranged on the second pixel 110b and that transmits only the light C2 of the second wavelength band. The first color separation element 131 may be arranged facing the second pixel 110b. Alternatively, some of the first and second color filters CF1 and CF2 may be omitted.

As illustrated in FIG. 6B, of the light incident on the first color separation element 131, the light C2 of the second wavelength band may be incident on the second pixel 110b by passing through the second color filter CF2 disposed directly under the first color separation element 131. Also, the light C1 of the first wavelength band may be incident on the first pixel 110a by obliquely traveling toward the left and right sides of the first color separation element 131 and passing through the first color filter CF1. In the second pixel row P2, if the color separation by the first color separation element 131 is sufficient, the color filter layer 150 may be omitted.

As illustrated in FIGS. 6A and 6B, in the first pixel row P1, the microlens 140 may be arranged extending in the third pixel 110c disposed at the opposite sides of the second pixel 110b. Also, in the second pixel row P2, the microlens 140 may be arranged extending in the first pixel 110a disposed at the opposite sides of the second pixel 110b. However, the image sensor according to the present exemplary embodiment may not include only the microlens 140 illustrated in FIGS. 6A and 6B. For example, a microlens 142 (refer to FIG. 9A) separately provided for each of the pixels 110a, 110b, and 110c may be used, or the microlens 140 may be omitted.

In the image sensor according to the present exemplary embodiment, improved light use efficiency and superior color purity may be simultaneously achieved by using the first and second color separation elements 131 and 132. Furthermore, since the Bayer pattern that is generally adopted in the image sensor is used without a change, the pixel structure and image processing algorithm of an image sensor of the related art do not need to be substantially changed. The image sensor according to the present exemplary embodiment may provide an image of superior quality by being applied to a variety of types of image pickup apparatuses.

Figure 3:
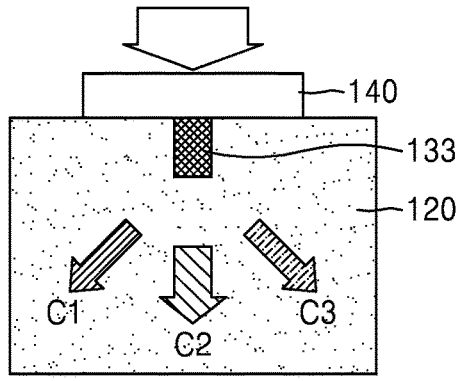
Figure 4:
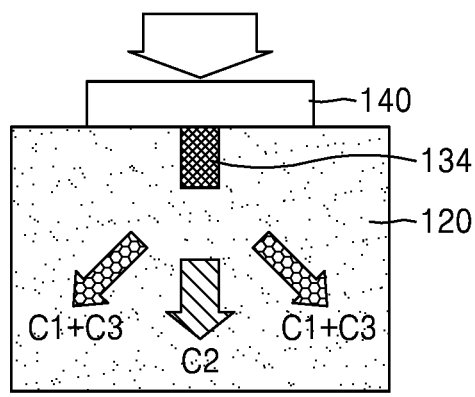
Figure 7:
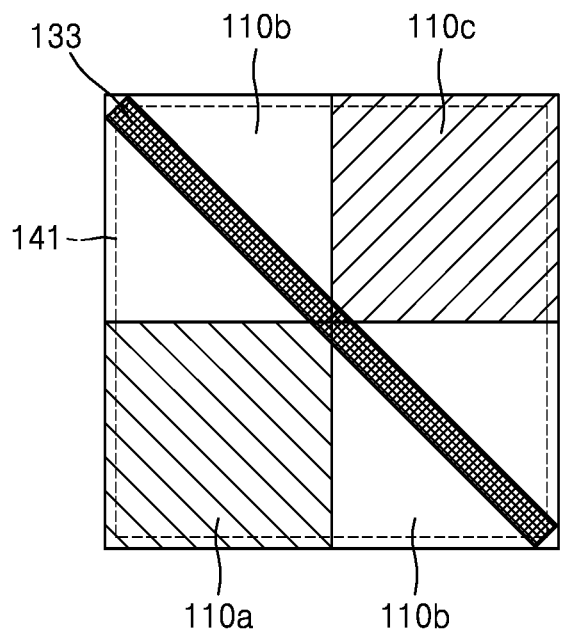
FIG. 7 is a plan view schematically illustrating a pixel structure of an image sensor including the color separation element of FIG. 3, according to another exemplary embodiment.

FIG. 7 is a plan view schematically illustrating a pixel structure of an image sensor including the third color separation element 133 of FIG. 3, according to another exemplary embodiment. Referring to FIG. 7, the image sensor may include a pixel array of a Bayer pattern structure that is the same as that of FIG. 5. In other words, the image sensor illustrated in FIG. 7 may include a Bayer pattern having the first pixel 110a and the third pixel 110c arranged in a first diagonal direction and two second pixels 110b arranged in a second diagonal direction crossing the first diagonal direction.

Also, the image sensor according to the present exemplary embodiment may include the third color separation element 133 that is arranged in the second diagonal direction. As illustrated in FIG. 7, the third color separation element 133 may be arranged in the second diagonal direction facing the two second pixels 110b. As described above, the third color separation element 133 may allow the light C1 of the first wavelength band of incident light to obliquely travel in a direction toward the left side, the light C2 of the second wavelength band of the incident light to travel in a direction directly under the third color separation element 133, and the light C3 of the third wavelength band of incident light to obliquely travel in a direction toward the right side. Accordingly, the light C1 of the first wavelength band separated by the third color separation element 133 may be incident on the first pixel 110a disposed at the left side of the third color separation element 133, and the light C2 of the second wavelength band separated by the third color separation element 133 may be incident on the two second pixels 110b disposed directly under the third color separation element 133. Also, the light C3 of the third wavelength band separated by the third color separation element 133 may be incident on the third pixel 110c disposed at the right side of the third color separation element 133. In order to prevent mixture of colors, the first to third color filters CF1, CF2, and CF3 illustrated in FIGS. 6A and 6B may be further respectively arranged at the first to third pixels 110a, 110b, and 110c corresponding thereto.

Also, the image sensor according to the present exemplary embodiment may further include a microlens 141 facing one unit having a Bayer pattern as indicated by a dotted line in FIG. 7. In this case, the microlens 141 may face the first pixel 110a and the third pixel 110c arranged in the first diagonal direction and the two second pixels 110b arranged in the second diagonal direction. However, the image sensor may not include only the microlens 141 of FIG. 7. For example, a microlens 143 (refer to FIG. 14) that is arranged in the second diagonal direction along the third color separation element 133 or the microlens 142 of FIG. 9A separately arranged for each of the pixels 110a, 110b, and 110c may be used, or the microlens 140 may be omitted.

Figure 8:
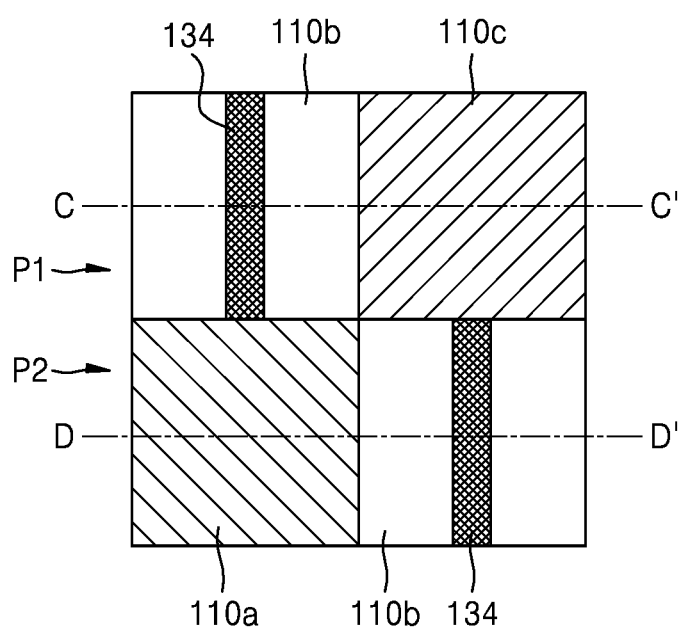
FIG. 8 is a plan view schematically illustrating a pixel structure of an image sensor including the color separation element of FIG. 4, according to another exemplary embodiment.

FIG. 8 is a plan view schematically illustrating a pixel structure of an image sensor including the color separation element 134 of FIG. 4, according to another exemplary embodiment. Referring to FIG. 8, the image sensor may include a pixel array having a Bayer pattern structure that is the same as that of FIG. 5. In other words, the image sensor illustrated in FIG. 8 may include a Bayer pattern having the first pixel 110a and the third pixel 110c arranged in the first diagonal direction and the two second pixels 110b arranged in the second diagonal direction.

Also, the image sensor according to the present exemplary embodiment may further include the fourth color separation element 134 that is arranged facing the second pixel 110b. In other words, the fourth color separation element 134 may be arranged facing the second pixel 110b in the first pixel row P1 and the second pixel 110b in the second pixel row P2. As described above, the fourth color separation element 134 may allow the light C2 of the second wavelength band of the incident light to travel in a direction directly under the fourth color separation element 134 and the light C1+C3 of the other wavelength band of the incident light to travel in oblique directions toward the left and right sides. Accordingly, the light C2 of the second wavelength band separated by the fourth color separation element 134 may be incident on the second pixel 110b of each of the first and second pixel rows P1 and P2. Also, the light C1+C3 of the other wavelength band, that is, a mixed light of the first light C1 of the first wavelength band and the third light C3 of the third wavelength band, may be incident on each of the third pixel 110c adjacent to the second pixel 110b in the first pixel row P1 and the first pixel 110a adjacent to the second pixel 110b in the second pixel row P2. For example, when the first light C1 of the first wavelength band is based on red, the second light C2 of the second wavelength band is based on green, and the third light C3 of the third wavelength band is based on blue, a green light may be incident on the second pixel 110b and magenta light may be incident on the first and third pixels 110a and 110c.

Figure 9A:
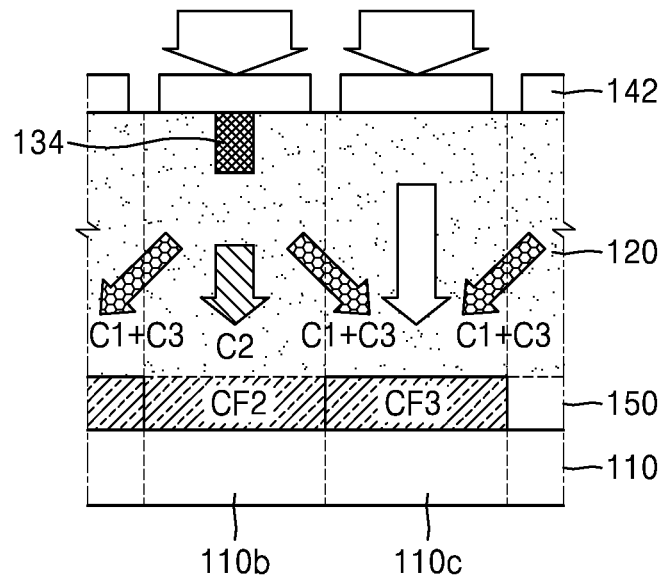
FIG. 9A is a cross-sectional view taken along the line C-C' of the image sensor of FIG. 8.
Figure 9B:
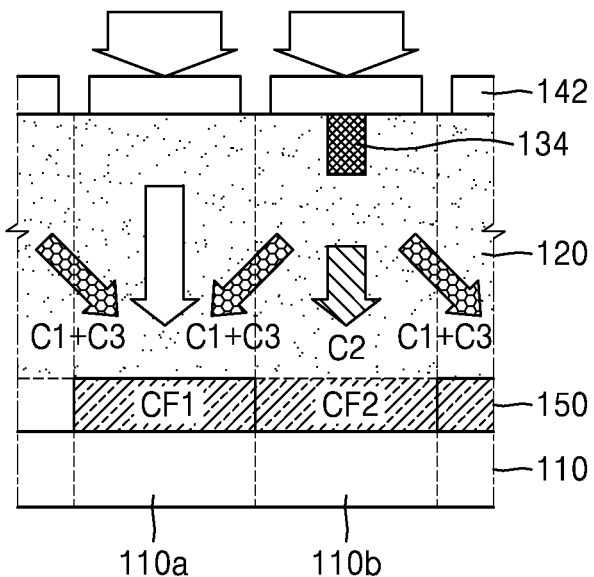
FIG. 9B is a cross-sectional view taken along the line D-D' of the image sensor of FIG. 8.

FIG. 9A is a cross-sectional view taken along the line C-C' of the first pixel row P1 in the image sensor of FIG. 8. FIG. 9B is a cross-sectional view taken along the line D-D' of the second pixel row P2 in the image sensor of FIG. 8. Referring to FIGS. 9A and 9B, the image sensor according to the present exemplary embodiment may further include the light sensing layer 110 that converts the intensity of incident light to an electric signal, the color filter layer 150 arranged on the light sensing layer 110, the transparent dielectric layer 120 arranged on the color filter layer 150, the fourth color separation element 134 buried in the transparent dielectric layer 120 and fixed therein, and the microlens 142 arranged on the transparent dielectric layer 120.

The second pixel 110b and the third pixel 110c may be arranged in the light sensing layer 110 of the first pixel row P1. The first pixel 110a and the second pixel 110b may be arranged in the light sensing layer 110 of the second pixel row P2. Also, in the first pixel row P1, the color filter layer 150 may include only the third color filter CF3 that is arranged on the third pixel 110c and, in the second pixel row P2, the color filter layer 150 may include only the first color filter CF1 that is arranged on the first pixel 110a. Accordingly, with respect to the light C1+C3 that is a mixed light of the first light C1 of the first wavelength band and the third light C3 of the third wavelength band, the third pixel 110c may absorb only the light C3 of the third wavelength band and the first pixel 110a may absorb only the light C1 of the first wavelength band. If the color separation efficiency is sufficiently high, a color filter may not be arranged on the second pixel 110b. However, to increase color purity, the second color filter CF2 may be arranged on the second pixel 110b. The fourth color separation element 134 may be arranged facing the second pixel 110b in the first pixel row P1 and the second pixel row P2.

Also, the microlens 142 may be separately arranged at each of the pixels 110a, 110b, and 110c. For example, the microlens 142 having one pixel size may be arranged at each of the first pixel 110a, the second pixel 110b, and the third pixel 110c. Then, only the light C2 of the second wavelength band of the light incident on the microlens 142 disposed on the second pixel 110b may be separated by the fourth color separation element 134 and provided to the second pixel 110b. The light C1+C3 of the first and third wavelength bands of the light incident on the microlens 142 disposed on the second pixel 110b may be separated by the fourth color separation element 134 and provided to the first pixel 110a adjacent to the opposite sides of the second pixel 110b (in case of the second pixel row P2) or the third pixel 110c (in case of the first pixel row P1). The light incident on the microlens 142 disposed on the first pixel 110a or the third pixel 110c is incident on the first pixel 110a or the third pixel 110c corresponding to the microlens 142 without a change. Accordingly, the light incident on the first and third pixels 110a and 110c is a sum of the light C1+C3 of the first and third wavelength bands separated by the fourth color separation element 134 and a white light passing through the microlens 142 corresponding to the first and third pixels 110a and 110c.

Figure 10:
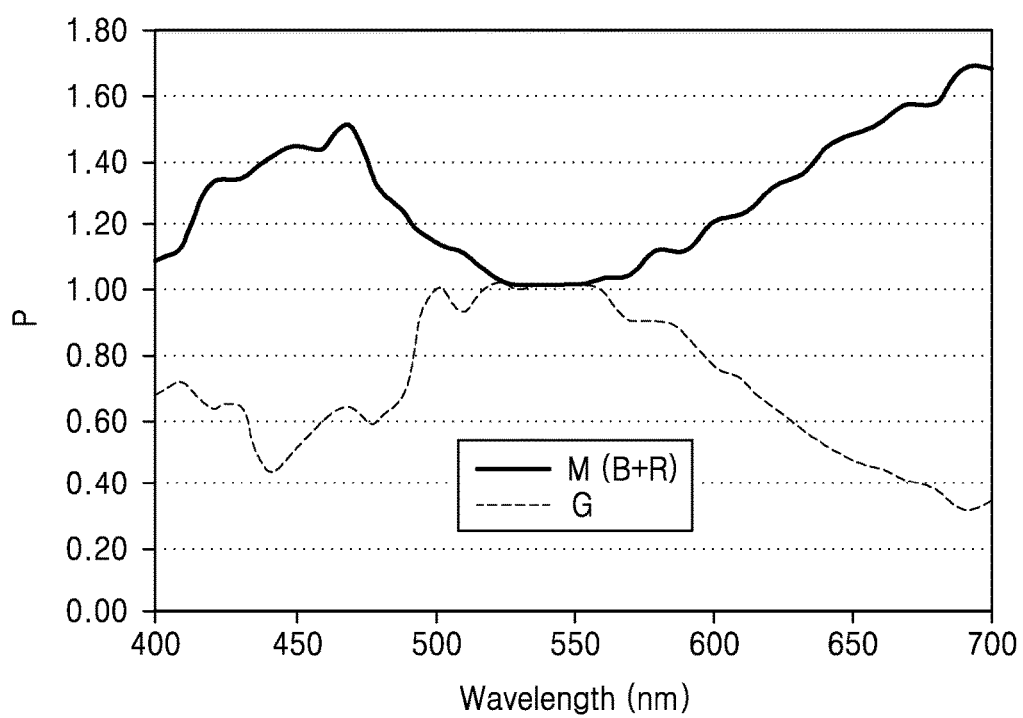
FIG. 10 is a graph exemplarily showing spectrum distributions of light incident on the pixels of the image sensor of FIG. 8.

For example, FIG. 10 is a graph exemplarily showing spectrum distributions of light incident on the pixels 110a, 110b, and 110c of the image sensor of FIG. 8, when the light C1 of the first wavelength band is a red light, the light C2 of the second wavelength band is a green light, and the light C3 of the third wavelength band is a blue light. In FIG. 10, a graph indicated by a dotted line indicates a spectrum distribution of light incident on the second pixel 110b, which shows that a green light component is the largest component. Also, in FIG. 10, a graph indicated by a solid line indicates a spectrum distribution of light incident on the first and third pixels 110a and 110c, which shows that a red light component and a blue light component are larger than a green light component. In particular, since the white light is further incident on the first and third pixels 110a and 110c, in FIG. 10, the graph indicated by a solid line is biased as large as a light amount of the white light, compared to the graph indicated by a dotted line.

Figure 11:
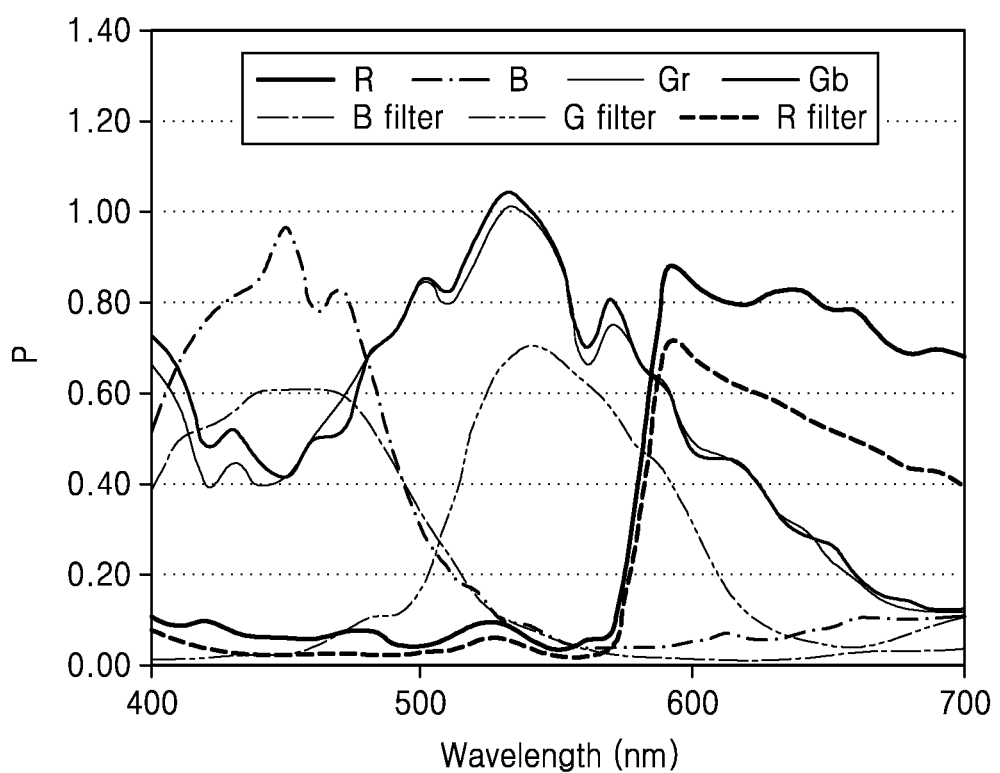
FIG. 11 is a graph exemplarily showing spectrum distributions of light absorbed by the pixels of the image sensor of FIG. 8.

As described above, since the light incident on each of the first to third pixels 110a, 110b, and 110c not only has a particular spectrum distribution but also has a large light amount, a high light use efficiency may be obtained even when the color filters CF1, CF2, and CF3 are arranged at the respective pixels 110a, 110b, and 110c. For example, FIG. 11 is a graph exemplarily showing spectrum distributions of light absorbed by the first to third pixels 110a, 110b, and 110c of the image sensor of FIG. 8 In the graph of FIG. 11, "R filter" denotes transmission characteristics of the first color filter CF1, "G filter" denotes transmission characteristics of the second color filter CF2, and "B filter" denotes transmission characteristics of the third color filter CF3. Also, in the graph of FIG. 11, "R" denotes an absorption spectrum of the first pixel 110a, "Gr" denotes an absorption spectrum of the second pixel 110b adjacent to the first pixel 110a, that is, the second pixel 110b arranged in the second pixel row P2, "Gb" denotes an absorption spectrum of the second pixel 110b adjacent to the third pixel 110c, that is, the second pixel 110b arranged in the first pixel row P1, and "B" denotes an absorption spectrum of the third pixel 110c. As illustrated in FIG. 11, a high light absorption amount may be obtained at all of the first to third pixels 110a, 110b, and 110c. Accordingly, an increase in the amplitude of a signal in the image sensor may be expected.

FIGS. 12 to 15 are plan views schematically illustrating pixel structures of image sensors according to various other exemplary embodiments.

Figure 12:
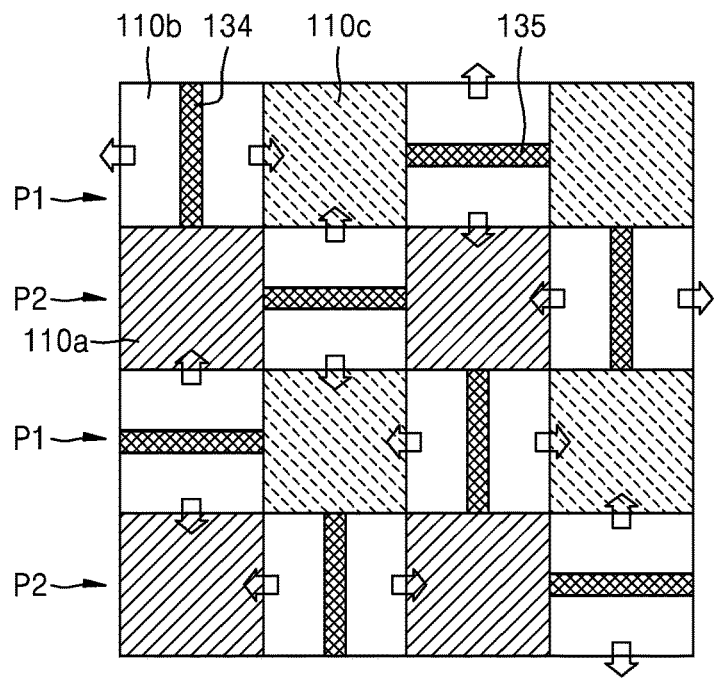
FIGS. 12, 13, 14 and 15 are plan views schematically illustrating pixel structures of image sensors according to various other exemplary embodiments.

First, referring to FIG. 12, an image sensor according to the present exemplary embodiment may include the fourth color separation elements 134 and a plurality of fifth color separation elements 135 which are alternately arranged at the second pixels 110b. For example, the fourth color separation element 134 may be arranged at the second pixel 110b that is the first one from the left side in the first pixel row P1, and the fifth color separation element 135 may be arranged at the second pixel 110b that is the second one from the left side in the first pixel row P1. The fifth color separation element 135 may be arranged at the second pixel 110b that is the first one from the left side in the second pixel row P2, and the fourth color separation element 134 may be arranged at the second pixel 110b that is the second one from the left side in the second pixel row P2. The other structure of the image sensor of FIG. 12 may be the same as that of the image sensor of FIG. 8.

The fifth color separation element 135 has the same color separation characteristics as those of the fourth color separation element 134 and is rotated by 90° with respect to the fourth color separation element 134. For example, the fourth color separation element 134 may allow the light C2 of the second wavelength band to travel in a direction directly under the fourth color separation element 134 and the light C1+C3 of the other wavelength band to travel in a first lateral direction, for example, in a horizontal direction in FIG. 12. In contrast, the fifth color separation element 135 may allow the light C2 of the second wavelength band to travel in a direction directly under the fifth color separation element 135 and the light C1+C3 of the other wavelength band to travel in a second lateral direction perpendicular to the first lateral direction, for example, in a vertical direction in FIG. 12.

In the image sensor of FIG. 8, the first pixel 110a and the third pixel 110c receive the light C1+C3 of the first and third wavelength bands from the opposite side surfaces facing each other. However, for the image sensor of FIG. 12, as indicated by arrows, the first pixel 110a and the third pixel 110c may receive the light C1+C3 of the first and third wavelength bands from the two side surfaces vertically adjoining each other.

Figure 13:
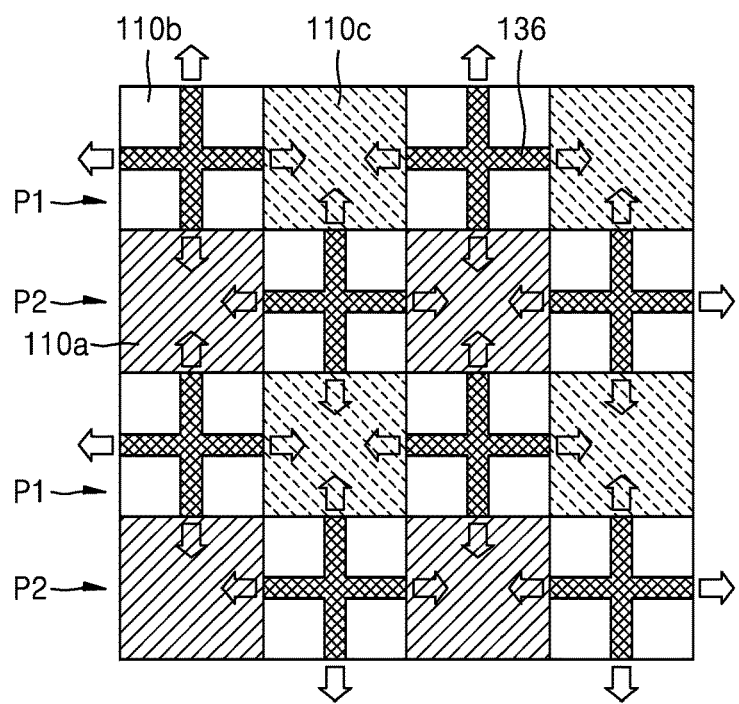

Also, referring to FIG. 13, an image sensor according to the present exemplary embodiment may include a plurality of sixth color separation elements 136 arranged at the second pixels 110b. The sixth color separation element 136 may be configured to allow the light C2 of the second wavelength band to travel in a direction directly under the sixth color separation element 136 and the light C1+C3 of the other wavelength band to travel in four different directions perpendicular to one another. For example, the sixth color separation element 136 may be formed by combining the fourth color separation element 134 and the fifth color separation element 135. In other words, the sixth color separation element 136 may be formed by simultaneously arranging the fourth color separation element 134 and the fifth color separation element 135 at one second pixel 110b. For the image sensor of FIG. 13, as indicated by an arrow, the first pixel 110a and the third pixel 110c may receive the light C1+C3 of the first and third wavelength bands from all four side surfaces. The other structure of the image sensor of FIG. 13 may be the same as that of the image sensor of FIG. 8.

Figure 14:
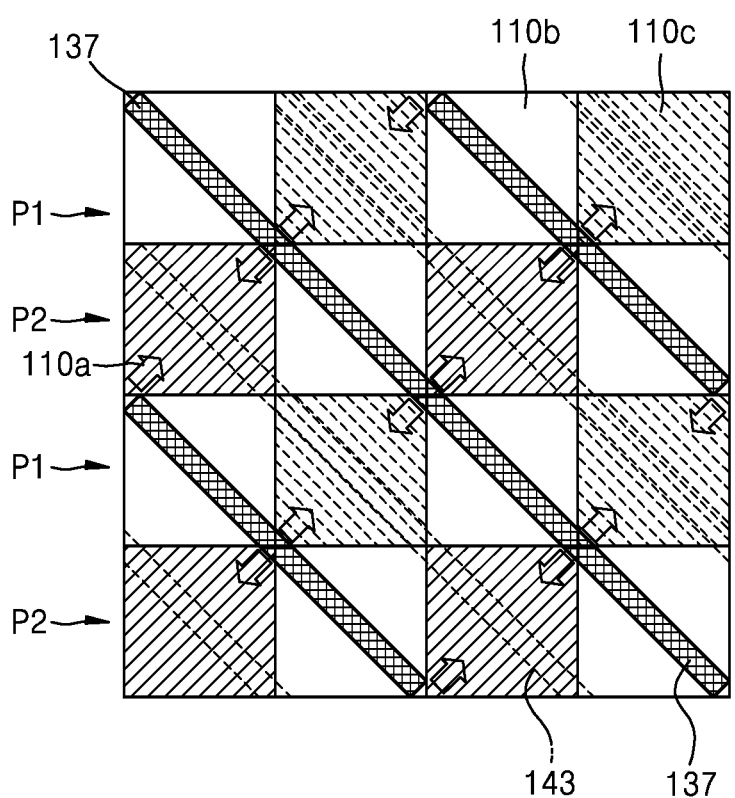

Also, referring to FIG. 14, an image sensor according to the present exemplary embodiment may include a seventh color separation element 137 arranged in a diagonal direction. For example, assuming that the first pixel 110a and the third pixel 110c are arranged in a first diagonal direction and the second pixels 110b are arranged in a second diagonal direction crossing the first diagonal direction, the seventh color separation element 137 may be arranged facing the second pixels 110b in the second diagonal direction. The seventh color separation element 137 may correspond to the fourth color separation element 134 that is oriented in the second diagonal direction. Accordingly, the seventh color separation element 137 may be configured to allow the light c2 of the second wavelength band to travel in a direction directly under the seventh color separation element 137 and the light C1+C3 of the other wavelength band to travel in the first diagonal direction.

Also, as indicated by a dotted line, the image sensor may further include a plurality of microlenses 143 arranged in the second diagonal direction along the seventh color separation element 137. For the image sensor of FIG. 14, as indicated by an arrow, the first pixel 110a and the third pixel 110c may receive the light C1+C3 of the first and third wavelength bands from the first diagonal direction.

Figure 15:
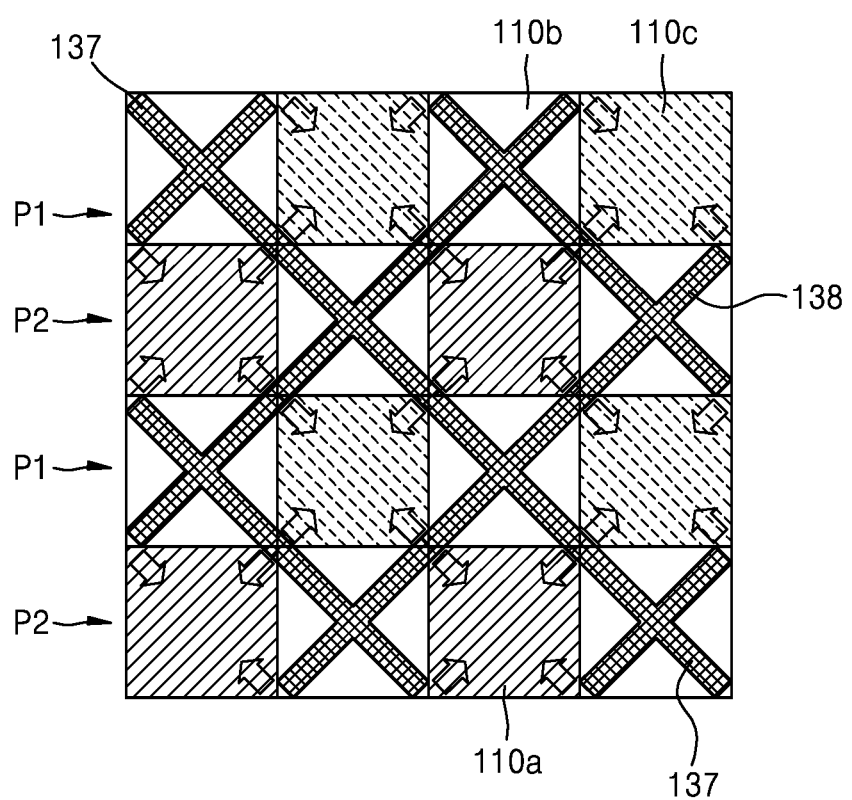

Referring to FIG. 15, an image sensor according to the present exemplary embodiment may include the seventh color separation element 137 arranged facing the second pixels 110b in the second diagonal direction and an eighth color separation element 138 arranged facing the second pixels 110b in the first diagonal direction. The seventh color separation element 137 may be configured to allow the light C2 of the second wavelength band to travel in a direction directly under the seventh color separation element 137 and the light C1+C3 of the other wavelength band to travel in the first diagonal direction. The eighth color separation element 138 may be configured to allow the light C2 of the second wavelength band to travel in a direction directly under the seventh color separation element 137 and the light C1+C3 of the other wavelength band to travel in the second diagonal direction. In light of the above, the eighth color separation element 138 has the same color separation characteristics as those of the seventh color separation element 137 and is rotated by 90° with respect to the seventh color separation element 137, or may correspond to the fourth color separation element 134 that is oriented in the first diagonal direction. For the image sensor of FIG. 15, as indicated by arrows, the first pixel 110a and the third pixel 110c may receive the light C1+C3 of the first and third wavelength bands respectively from the first and second diagonal directions.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. An image sensor comprising:
a pixel array including Bayer patterns, each of the Bayer patterns including a first pixel and a third pixel provided in a first diagonal direction and two second pixels provided in a second diagonal direction crossing the first diagonal direction; and
a color separation element provided to face the second pixels in the second diagonal direction,
wherein the color separation element is configured to control light of a first wavelength band of incident light to travel in a first lateral direction of the color separation element toward the first pixel, to control light of a third wavelength band of the incident light to travel in a second lateral direction of the color separation element toward the third pixel, and to control light of a second wavelength band of the incident light to travel in a downward direction of the color separation element toward the second pixels, wherein the color separation element has a shape of a transparent rod and partially covers the second pixels.

2. The image sensor of claim 1, further comprising a color filter layer that is provided on the pixel array, wherein the color filter layer comprises at least one of a first color filter provided adjacent to the first pixel, a second color filter provided adjacent to the second pixel, and a third color filter provided adjacent to the third pixel.

3. The image sensor of claim 2, further comprising:
a transparent dielectric layer provided on the color filter layer; and
a microlens provided on the transparent dielectric layer.

4. The image sensor of claim 3, wherein the microlens is provided to face the pixel array including the Bayer patterns.

5. An image sensor comprising:
a pixel array including Bayer patterns, each of the Bayer patterns including a first pixel and a third pixel provided in a first diagonal direction and two second pixels provided in a second diagonal direction crossing the first diagonal direction;
color separation elements provided to face the second pixels, respectively; and
a color filter layer provided on the pixel array,
wherein each of the color separation elements is configured to control light of a second wavelength band of incident light to travel in a downward direction of each of the color separation elements and to control mixed light including a mixture of light of a first wavelength band of the incident light and light of a third wavelength band of the incident light to travel in directions toward left and right sides of each of the color separation elements,
wherein each of the color separation elements has a shape of a transparent rod and partially covers the second pixels.

6. The image sensor of claim 5, wherein one of the color separation elements comprises a first color separation element provided in a first direction and a second color separation element provided in a second direction perpendicular to the first direction.

7. The image sensor of claim 6, wherein the first color separation element and the second color separation element are alternately provided to face the second pixels.

8. The image sensor of claim 6, wherein both of the first color separation element and the second color separation element are provided adjacent to one of the second pixels.

9. The image sensor of claim 5, wherein the color separation elements are oriented in the second diagonal direction.

10. The image sensor of claim 5, wherein one of the color separation elements comprises a first color separation element oriented in the first diagonal direction and a second color separation element oriented in the second diagonal direction.

11. The image sensor of claim 5, further comprising:
a transparent dielectric layer provided on the color filter layer; and
microlenses provided on the transparent dielectric layer,
wherein the microlenses are separately provided at each of the first, second, and third pixels.

12. The image sensor of claim 11, wherein the color filter layer comprises a first color filter provided on the first pixel and is configured to transmit the light of the first wavelength band, and a third color filter provided on the third pixel and is configured to transmit the light of the third wavelength band, and
wherein the light of the second wavelength band separated by the color separation elements is incident on the second pixels and the mixed light of the first and third wavelength bands and a white light are incident together on the first and third color filters.

13. The image sensor of claim 12, wherein the light of the first wavelength band is red light, the light of the second wavelength band is green light, and the light of the third wavelength band is blue light.

14. An image sensor comprising:
a pixel array including a first pixel and a third pixel provided in a first diagonal direction and two second pixels provided in a second diagonal direction crossing the first diagonal direction; and
a first color separation element oriented in the second diagonal direction and facing the second pixels,
wherein the first color separation element has a shape of a transparent rod and partially covers the second pixels.

15. The image sensor of claim 14, further comprising a second color separation element oriented in the first diagonal direction and facing the second pixels.

16. The image sensor of claim 15, wherein the first color separation element is configured to control light of a first wavelength band of incident light to travel in a first lateral direction of the first color separation element toward the first pixel, to control light of a third wavelength band of the incident light to travel in a second lateral direction of the first color separation element toward the third pixel, and to control light of a second wavelength band of the incident light to travel in a downward direction of the first color separation element toward the second pixels.

17. The image sensor of claim 15, wherein the second color separation element is configured to control light of a first wavelength band of incident light to travel in a first lateral direction of the second color separation element toward the first pixel, to control light of a third wavelength band of the incident light to travel in a second lateral direction of the second color separation element toward the third pixel, and to control light of a second wavelength band of the incident light to travel in a downward direction of the second color separation element toward the second pixels.

18. The image sensor of claim 14, further comprising a color filter layer that is provided on the pixel array, wherein the color filter layer comprises at least one of a first color filter provided adjacent to the first pixel, a second color filter provided adjacent to the second pixel, and a third color filter provided adjacent to the third pixel.

19. The image sensor of claim 18, further comprising a transparent dielectric layer provided on the color filter layer, wherein the first color separation element is buried in the transparent dielectric layer.

* * * * *